(12) United States Patent
Tsukada et al.

(10) Patent No.: US 10,506,186 B2
(45) Date of Patent: Dec. 10, 2019

(54) SOLID-STATE IMAGING DEVICE AND SOLID-STATE IMAGING APPARATUS

(71) Applicant: SONY CORPORATION, Tokyo (JP)

(72) Inventors: Atsushi Tsukada, Kanagawa (JP); Eiichirou Kishida, Kumamoto (JP); Daisuke Nakatsuru, Kumamoto (JP); Hiroyuki Kaji, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/772,584

(22) PCT Filed: Oct. 14, 2016

(86) PCT No.: PCT/JP2016/004586
§ 371 (c)(1),
(2) Date: May 1, 2018

(87) PCT Pub. No.: WO2017/081840
PCT Pub. Date: May 18, 2017

(65) Prior Publication Data
US 2019/0098237 A1 Mar. 28, 2019

(30) Foreign Application Priority Data

Nov. 12, 2015 (JP) ................................ 2015-222165

(51) Int. Cl.
*H04N 5/369* (2011.01)
*H01L 21/52* (2006.01)
(Continued)

(52) U.S. Cl.
CPC ............. *H04N 5/369* (2013.01); *H01L 21/52* (2013.01); *H01L 23/00* (2013.01);
(Continued)

(58) Field of Classification Search
CPC ........... H01L 21/52; H01L 2224/32225; H01L 23/00; H01L 27/14618; H01L 27/14636;
(Continued)

(56) References Cited

U.S. PATENT DOCUMENTS

| 2012/0008025 A1 | 1/2012 | Sasano et al. |
| 2012/0126379 A1* | 5/2012 | Uenda ........................ C09J 7/28 257/659 |

(Continued)

FOREIGN PATENT DOCUMENTS

| CN | 102299147 A | 12/2011 |
| CN | 102468185 A | 5/2012 |

(Continued)

OTHER PUBLICATIONS

International Search Report and Written Opinion of PCT Application No. PCT/JP2016/004586, dated Dec. 13, 2016, 09 pages of ISRWO.

*Primary Examiner* — Amy R Hsu
(74) *Attorney, Agent, or Firm* — Chip Law Group

(57) ABSTRACT

[Object] To provide a solid-state imaging device, with which degradation of properties of a solid-state image sensor under the influence of magnetic force lines generated from wiring arranged in the package is prevented, and a solid-state imaging apparatus including the same. [Solving Means] A solid-state imaging device according to the present technology includes a package, a seal glass, a solid-state image sensor, and a shield. The package includes wiring inside and a recess. The seal glass is joined to the package and closes the recess. The solid-state image sensor is housed in a space formed by the recess and the seal glass. The shield is housed in the space and arranged on the package. The shield prevents an arrival of magnetic force lines generated from the wiring at the solid-state image sensor.

7 Claims, 7 Drawing Sheets

(51) Int. Cl.
*H01L 31/02* (2006.01)
*H01L 27/146* (2006.01)
*H04N 5/225* (2006.01)
*H01L 23/00* (2006.01)

(52) U.S. Cl.
CPC .. *H01L 27/14618* (2013.01); *H01L 27/14636* (2013.01); *H01L 31/02* (2013.01); *H04N 5/2257* (2013.01); H01L 2224/32225 (2013.01); H01L 2924/16195 (2013.01); H04N 5/2253 (2013.01)

(58) Field of Classification Search
CPC .......... H01L 2924/16195; H01L 31/02; H04N 5/2257; H04N 5/357; H04N 5/369
See application file for complete search history.

(56) References Cited

U.S. PATENT DOCUMENTS

| | | | |
|---|---|---|---|
| 2012/0126381 A1* | 5/2012 | Uenda | H01L 21/6836 257/659 |
| 2013/0010145 A1 | 1/2013 | Hagiwara et al. | |
| 2013/0083229 A1* | 4/2013 | Lin | H01L 27/14623 348/336 |
| 2014/0048955 A1* | 2/2014 | Lin | H01L 23/481 257/774 |
| 2014/0218573 A1 | 8/2014 | Hagiwara et al. | |
| 2014/0339668 A1* | 11/2014 | Arima | H01L 23/4006 257/443 |
| 2015/0123234 A1 | 5/2015 | Hagiwara et al. | |
| 2016/0056188 A1* | 2/2016 | Lee | H01L 27/1463 257/446 |
| 2017/0094183 A1* | 3/2017 | Miller | H04N 5/23296 |

FOREIGN PATENT DOCUMENTS

| | | |
|---|---|---|
| CN | 102569263 A | 7/2012 |
| CN | 102867836 A | 1/2013 |
| CN | 103996672 A | 8/2014 |
| CN | 104094405 A | 10/2014 |
| EP | 2400551 A2 | 12/2011 |
| EP | 2814063 A1 | 12/2014 |
| JP | 2005-032970 A | 2/2005 |
| JP | 2005-086100 A | 3/2005 |
| JP | M05-086100 A | 3/2005 |
| JP | 2012-009547 A | 1/2012 |
| JP | 2012-122058 A | 6/2012 |
| JP | 2012-124466 A | 6/2012 |
| JP | 2013-021031 A | 1/2013 |
| JP | 2014-150150 A | 8/2014 |
| JP | 2016-119493 A | 6/2016 |
| KR | 10-2011-0139648 A | 12/2011 |
| KR | 10-2012-0053967 A | 5/2012 |
| KR | 10-2012-0053968 A | 5/2012 |
| KR | 10-2014-0128415 A | 11/2014 |
| TW | 201212217 | 3/2012 |
| TW | 201221614 | 6/2012 |
| TW | 201226521 A | 7/2012 |
| WO | 2013/118501 A1 | 8/2013 |

* cited by examiner

SOLID-STATE IMAGING DEVICE AND SOLID-STATE IMAGING APPARATUS

CROSS REFERENCE TO RELATED APPLICATIONS

This application is a U.S. National Phase of International Patent Application No. PCT/JP2016/004586 filed on Oct. 14, 2016, which claims priority benefit of Japanese Patent Application No. JP 2015-222165 filed in the Japan Patent Office on Nov. 12, 2015. Each of the above-referenced applications is hereby incorporated herein by reference in its entirety.

TECHNICAL FIELD

The present technology relates to a solid-state imaging device and a solid-state imaging apparatus including the same.

BACKGROUND ART

A solid-state imaging device using a solid-state image sensor such as a CCD (charge coupled device) and a CMOS (complementary metal oxide semiconductor) sensor is mounted on a product such as a still camera, a video camera, and a monitor camera and is used under a variety of environments. In recent years, in the solid-state imaging device, a measure to diminish the influence of external electromagnetic waves and magnetic field fluctuation is required in order to realize high sensitivity and high resolution.

From that viewpoint, for example, Patent Literature 1 discloses a solid-state imaging device where a conductor is arranged at an outer periphery of a package on which semiconductor devices (solid-state image sensors) are mounted. According to this structure, the package has high electromagnetic shielding properties and an external electromagnetic wave immunity of the solid-state imaging device is improved.

CITATION LIST

Patent Literature

Patent Literature 1: Japanese Patent Application Laid-open No. 2014-150150

DISCLOSURE OF INVENTION

Technical Problem

However, in recent years, a solid-state imaging device has a specification that a large amount of current flows. As a result, even though the technology that the conductor is arranged at the outer periphery of the package is applied as disclosed in Patent Literature 1, degradation of properties of the solid-state image sensor under the influence of the magnetic force lines from wiring arranged in the package may not be prevented.

The present technology is made in view of the above-mentioned circumstances, and it is an object of the present technology to provide a solid-state imaging device, with which degradation of properties of a solid-state image sensor under the influence of magnetic force lines generated from wiring arranged in the package is prevented, and a solid-state imaging apparatus including the same.

Solution to Problem

In order to achieve the object, a solid-state imaging device according to an embodiment of the present technology includes a package, a seal glass, a solid-state image sensor, and a shield.

The package includes wiring inside and a recess.

The seal glass is joined to the package and closes the recess.

The solid-state image sensor is housed in a space formed by the recess and the seal glass.

The shield is housed in the space and arranged on the package.

The shield prevents an arrival of magnetic force lines generated from the wiring at the solid-state image sensor.

According to this structure, the shield is housed in the space together with the solid-state image sensor and arranged on the package including the wiring inside. Here, the shield prevents an arrival of magnetic force lines generated from the wiring at the solid-state image sensor. Accordingly, the present technology can provide a solid-state imaging device, with which degradation of properties of the solid-state image sensor under the influence of magnetic force lines generated from the wiring arranged in the package is prevented.

The shield may be arranged between the solid-state image sensor and the package.

According to this structure, even when the wiring is arranged inside of the package directly under the solid-state image sensor, the magnetic force lines generated from the wiring are drawn to the shield and are prevented from arriving at the solid-state image sensor. Accordingly, the degradation of properties of the solid-state image sensor under the influence of the magnetic force lines can be prevented.

The shield may be arranged around the solid-state image sensor.

The shield may include a first shield and a second shield, and the first shield and the second shield may be arranged at a distance between the solid-state image sensor and the package.

The shield may be formed of a magnetic material.

Since the shield is formed of the magnetic material, the shield can draw the magnetic force lines generated from the wiring and prevent the magnetic force lines from arriving at the solid-state image sensor. According to this structure, the degradation of properties of the solid-state image sensor under the influence of the magnetic force lines can be prevented.

The shield may be a conductor formed of copper or iron.

According to this structure, the magnetic force lines generated from the wiring are counteracted by magnetic force lines (magnetic force lines that rotate in a direction opposite to the rotation direction of the magnetic force lines) generated from the conductor such as copper and iron and are prevented from arriving at the solid-state image sensor. Accordingly, even when the shield is the conductor such as copper and iron, the solid-state image sensor can be protected from the magnetic force lines generated from the wiring.

The shield may be a die bonding film including a magnetic material and bond the solid-state image sensor to the package.

According to this structure, not only the magnetic force lines generated from the package are prevented from arriving at the solid-state image sensor, but also the step of bonding the solid-state image sensor to the shield can be omitted when designing the solid-state imaging device. Accordingly, the productivity can be improved when the solid-state imaging device is manufactured.

The shield may be a die bonding film including a conductor formed of copper or iron and bond the solid-state image sensor to the package.

In order to achieve the object, a solid-state imaging apparatus according to an embodiment of the present technology includes a solid-state imaging device and an optical system for imaging.

The solid-state imaging device includes a solid-state imaging device including a package including wiring inside and a recess, a seal glass joined to the package and closing the recess, a solid-state image sensor housed in a space formed by the recess and the seal glass, and a shield housed in the space and arranged on the package, the shield preventing an arrival of magnetic force lines generated from the wiring at the solid-state image sensor.

The optical system for imaging collects incident light on the solid-state image sensor.

Advantageous Effects of Invention

As described above, the present technology can provide a solid-state imaging device, with which degradation of properties of the solid-state image sensor under the influence of magnetic force lines generated from the wiring arranged in the package is prevented, and a solid-state imaging apparatus including the same.

MODE(S) FOR CARRYING OUT THE INVENTION

Hereinafter, a solid-state imaging device of an embodiment of the present disclosure will be described.

[Structure of Solid-State Imaging Device]

Figure 1:
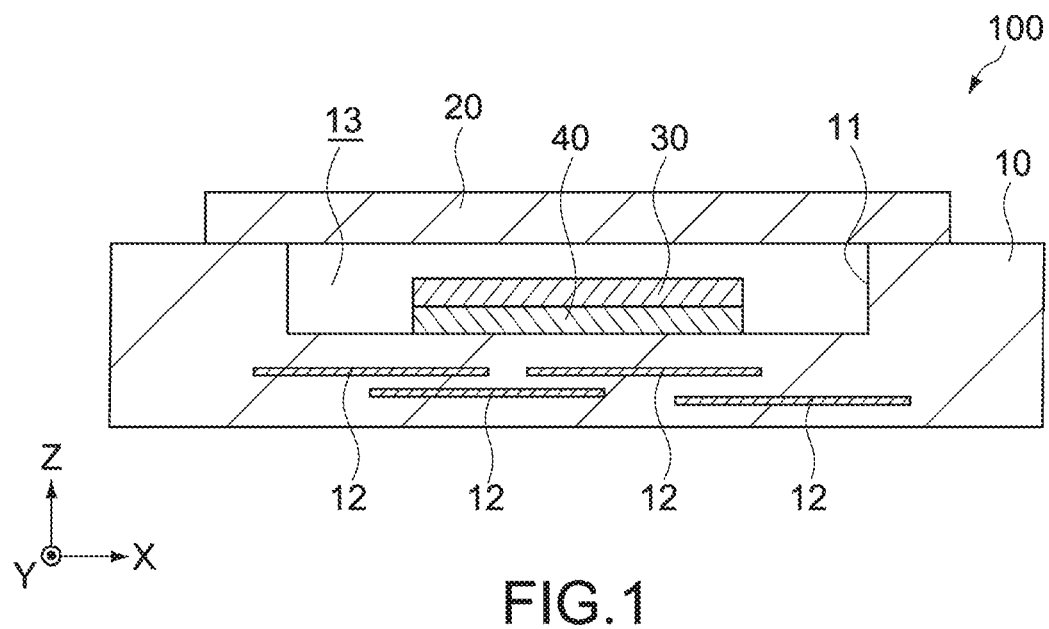
FIG. 1 is a cross-sectional view showing a solid-state imaging device according to an embodiment of the present technology.
Figure 2:
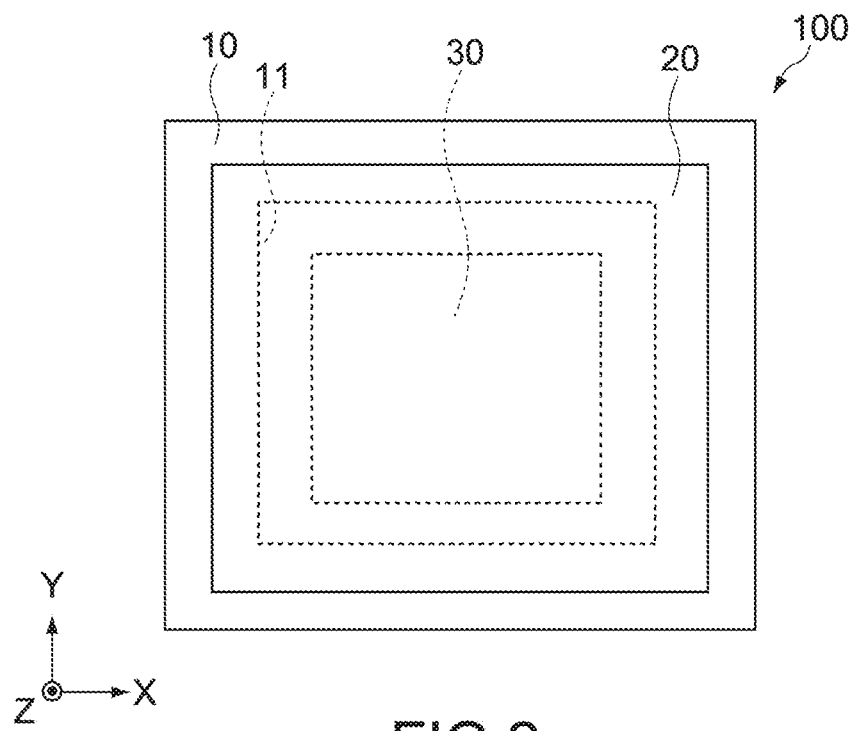
FIG. 2 is a schematic view showing the solid-state imaging device.

FIG. 1 is a cross-sectional view showing a solid-state imaging device 100, and FIG. 2 is a plan view showing the solid-state imaging device 100. In the following figures, the X direction, the Y direction, and the Z direction are three directions orthogonal to each other.

The solid-state imaging device 100 according to this embodiment includes a package 10, a seal glass 20, a solid-state image sensor 30, and a shield 40, as shown in FIG. 1.

The package 10 has a recess 11, as shown in FIG. 1. The recess 11 is formed in the package 10 and is deeper than the total thickness (distance in the Z direction) of the solid-state image sensor 30 and the shield 40, as shown in FIG. 1.

In addition, the package 10 includes package wiring 12 inside, as shown in FIG. 1. The package 10 is a laminate-type package such as, for example, LTCC (law temperature co-fired ceramics) and HTCC (high temperature co-fired ceramics). The package wiring 12 may be arranged in the respective layers of the package.

The package wiring 12 electrically connects an external terminal (not shown) of the package 10 to the solid-state image sensor 30. The package wiring 12 is electrically connected to the solid-state image sensor 30 by wire bonding, for example. A material of the package wiring 12 is not especially limited, but may be tungsten, copper, or the like, for example.

The package 10 may be formed of a material such as synthetic resin and ceramics, for example. Note that the material of the package 10 is not especially limited as long as the material has insulation properties.

The seal glass 20 is joined to the package 10 with an adhesive or the like and seals the recess 11, as shown in FIG. 1. The seal glass 20 has optical transparency and has a function to prevent scratches and attachment of dust and the like on the solid-state image sensor 30.

Preferably, a material of the seal glass 20 is borosilicate glass, quartz glass, non-alkali glass, Pyrex (registered trademark) glass, or the like. Note that an IR cut filter, a crystal low pass filter, or the like may be used in the solid-state imaging device 100 instead of the seal glass 20.

The solid-state image sensor 30 is housed in a space 13 formed by the seal glass 20 and the recess 11, as shown in FIG. 1.

The solid-state image sensor 30 includes a signal processing region and a circuit region arranged around the signal processing region. The signal processing region includes a pixel region where photodiodes for converting light to electric signals are one-dimensionally or two-dimensionally arranged. The signal processing area further includes an amplifying circuit, a memory, and the like arranged around the pixel region.

The kind of the solid-state imaging device 100 is not especially limited, but may be a CCD (charge coupled device) sensor, a CMOS (complementary metal oxide semiconductor) sensor, or the like.

The shield 40 is housed in the space 13 and arranged on the package 10, as shown in FIG. 1. Also, the shield 40 is arranged between the solid-state image sensor 30 and the package 10, as shown in FIG. 1. A material of the shield 40 may be a magnetic body or a conductor such as copper and iron, and is preferably an iron-nickel based soft magnetic material.

As a material of the iron-nickel based soft magnetic material, a PB, PC, PD, PE, or PF-based permalloy material defined by JIS C 2531 may be used, for example.

[Shield Effect]

Figure 3:
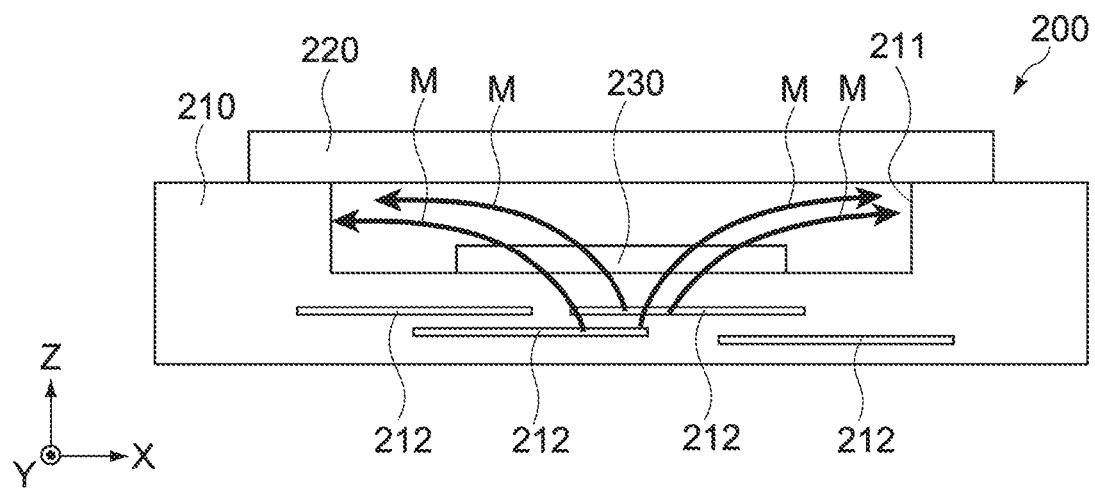
FIG. 3 is a schematic diagram showing a solid-state imaging device according to a comparative embodiment of the present technology.
Figure 4:
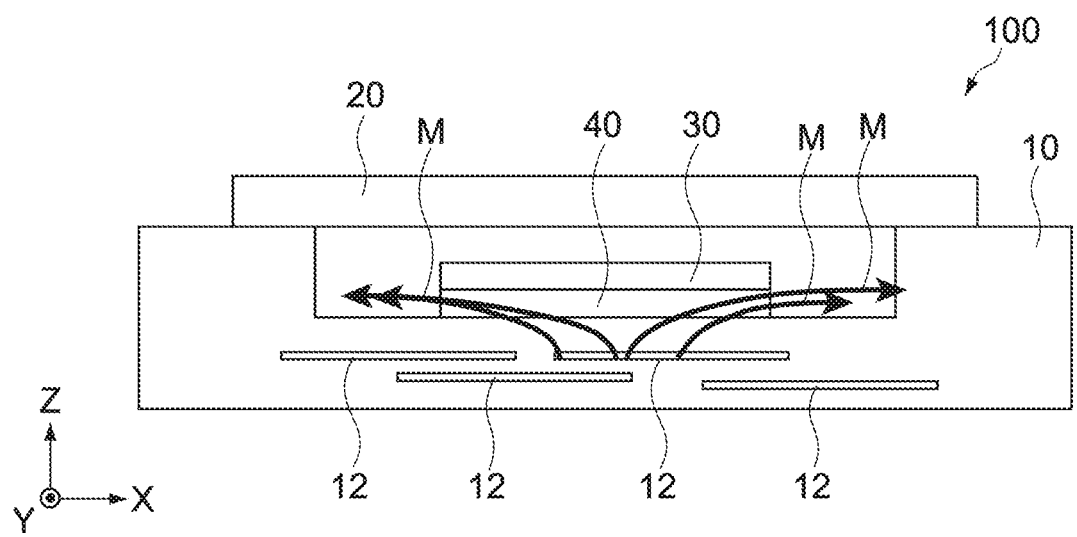
FIG. 4 is a schematic diagram showing the solid-state imaging device according to an embodiment of the present technology.

An effect of the shield 40 will be described using a comparative embodiment. FIG. 3 is a schematic diagram showing a solid-state imaging device 200 according to a comparative embodiment, and FIG. 4 is a schematic diagram showing the solid-state imaging device 100 according to this embodiment. As shown in FIG. 3, the solid-state imaging device 200 includes a package 210 having a recess 211, a seal glass 220, and a solid-state image sensor 230.

The package 210 of the solid-state imaging device 200 includes package wiring 212 inside and arranged directly below the solid-state image sensor 230, as shown in FIG. 3. Here, as shown in FIG. 3, no shield is arranged in the solid-state imaging device 200 different from the solid-state imaging device 100 according to this embodiment.

Therefore, in a case where a large current flows through the package wiring 212, magnetic force lines M generated from the package wiring 212 may arrive at the solid-state image sensor 230 and the solid-state image sensor 230 may have degraded properties, as shown in FIG. 3.

However, in the solid-state imaging device 100 according to the present technology, the shield 40 is arranged between the solid-state image sensor 30 and the package 10, as shown in FIG. 1 and FIG. 2. Here, a material of the shield 40 is a ferromagnetic material. Even if a large current flows through the package wiring 12, the magnetic force lines M generated from the package wiring 12 are drawn to the shield 40, as shown in FIG. 4.

Specifically, in a case where the shield 40 formed of a ferromagnetic material is arranged between the solid-state image sensor 30 and the package 10, the magnetic force lines M generated from the package wiring 12 can be prevented from arriving at the solid-state image sensor 30. As a result, degradation of properties of the solid-state image sensor 30 under the influence of the magnetic force lines M generated from the package wiring 12 can be prevented.

Also, the shield 40 may be a conductor such as copper and iron, as described above. In this manner, the magnetic force lines M generated from the package wiring 12 are counteracted by magnetic force lines (magnetic force lines that rotate in a direction opposite to the rotation direction of the magnetic force lines M) generated from the conductor such as copper and iron and are prevented from arriving at the solid-state image sensor 30. Accordingly, even when the shield 40 is the conductor such as copper and iron, the degradation of properties of the solid-state image sensor 30 under the influence of the magnetic force lines M can be prevented.

Thus, there is no need to apply processing of shielding electromagnetic waves to the package wiring 12 or to improve the arrangement of the package wiring 12 in the package 10 in order to prevent the degradation of properties of the solid-state image sensor 30 under the influence of the magnetic force lines M. As a result, flexibility of design of the solid-state imaging device 100 can be ensured. Accordingly, it is possible to make the solid-state imaging device 100 according to this embodiment smaller than a solid-state imaging device in the related art.

ALTERNATIVE EMBODIMENTS

Next, alternative embodiments of the solid-state imaging device 100 with respect to its structure will be described.

Alternative Embodiment 1

Figure 5:
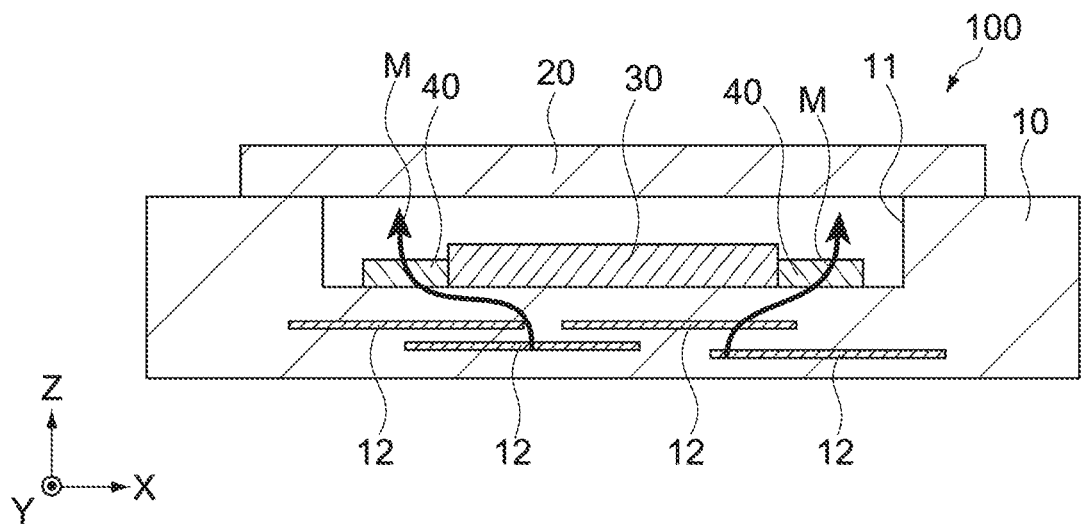
FIG. 5 is a cross-sectional view showing a solid-state imaging device according to an alternative embodiment 1.
Figure 6:
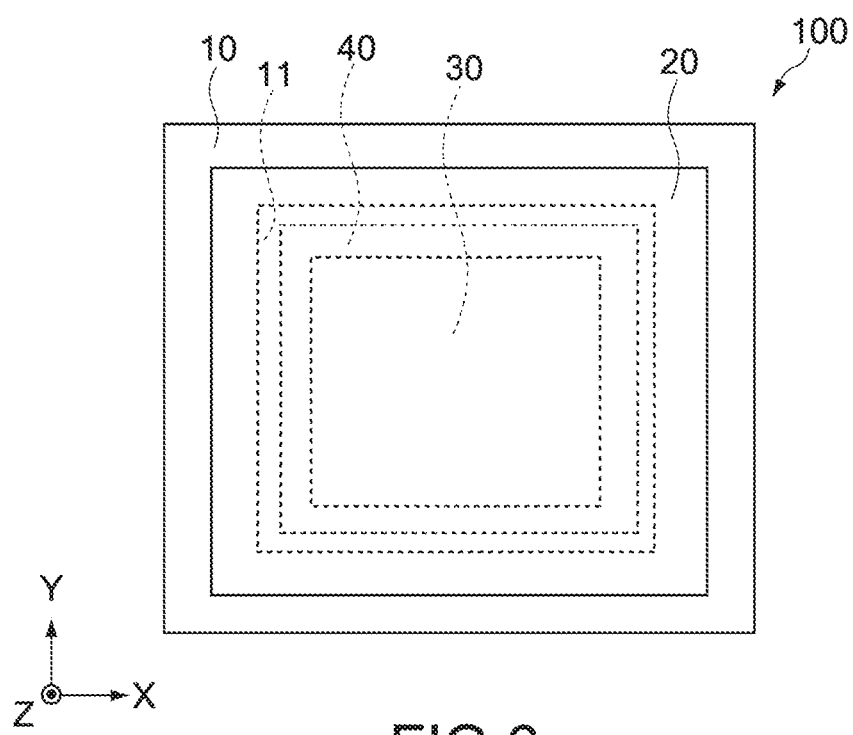
FIG. 6 is a plan view showing the solid-state imaging device.

FIG. 5 is a cross-sectional view showing the solid-state imaging device 100 according to an alternative embodiment 1, and FIG. 6 is a plan view showing the solid-state imaging device 100 according to an alternative embodiment 1. The solid-state imaging device 100 is not limited to the structure shown in FIG. 1 and FIG. 2 and may have a structure where the shield 40 is arranged around the solid-state image sensor 30, as shown in FIG. 5 and FIG. 6. In this case, the shield 40 is formed of the ferromagnetic material.

As a result, even when the package wiring 12 is arranged inside of the package 10 directly under the solid-state image sensor 30, the magnetic force lines M generated from package wiring 12 are drawn to the shield 40, as shown in FIG. 5. As a result, the magnetic force lines M can be prevented from arriving at the solid-state image sensor 30. Accordingly, even when the structure of the solid-state imaging device 100 shown in FIG. 5 and FIG. 6 is used, the degradation of properties of the solid-state image sensor 30 under the influence of the magnetic force lines M can be prevented.

Alternative Embodiment 2

Figure 7:
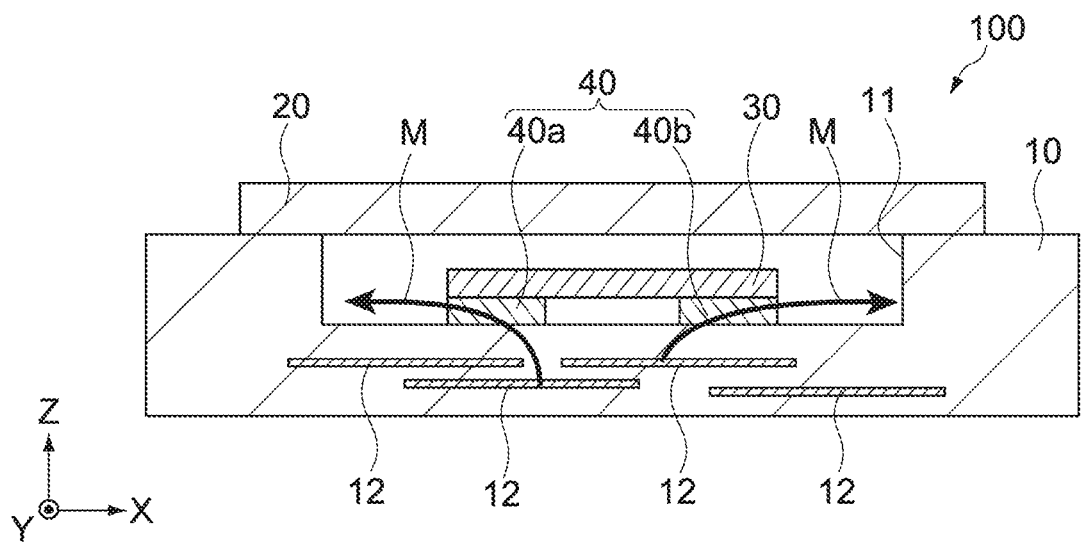
FIG. 7 is a cross-sectional view showing a solid-state imaging device according to an alternative embodiment 2.
Figure 8:
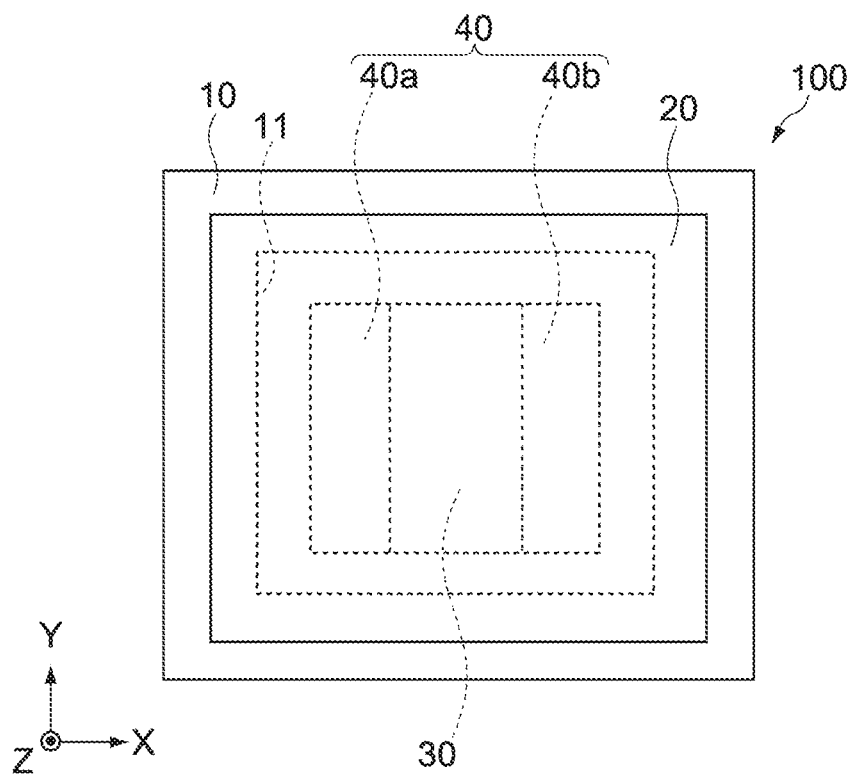
FIG. 8 is a plan view showing the solid-state imaging device.

FIG. 7 is a cross-sectional view showing the solid-state imaging device 100 according to an alternative embodiment 2, and FIG. 8 is a plan view showing the solid-state imaging device 100 according to an alternative embodiment 2. The solid-state imaging device 100 may have the structure that the shield 40 includes a first shield 40a and a second shield 40b and the first shield 40a and the second shield 40b are arranged at a distance between the solid-state image sensor 30 and the package 10, as shown in FIG. 7 and FIG. 8. In this case, the material of the shield 40 (first shield 40a and second shield 40b) is a ferromagnetic material or a conductor such as copper and iron.

As a result, even when the package wiring 12 is arranged inside of the package 10 directly under the solid-state image sensor 30, the magnetic force lines M generated from package wiring 12 are drawn to the shield 40 in a case where the shield 40 is formed of a ferromagnetic material, as shown in FIG. 7. As a result, the magnetic force lines M can be prevented from arriving at the solid-state image sensor.

Accordingly, even when the structure of the solid-state imaging device 100 shown in FIG. 7 and FIG. 8 is used, the degradation of properties of the solid-state image sensor 30 under the influence of the magnetic force lines M can be prevented. Note that in the solid-state imaging device 100 according to alternative embodiment 2, the magnetic force lines M are counteracted even when the shield 40 is a conductor such as copper and iron and it is possible to prevent the degradation of properties of the solid-state image sensor 30 under the influence of magnetic force lines M.

Alternative Embodiment 3

Figure 9:
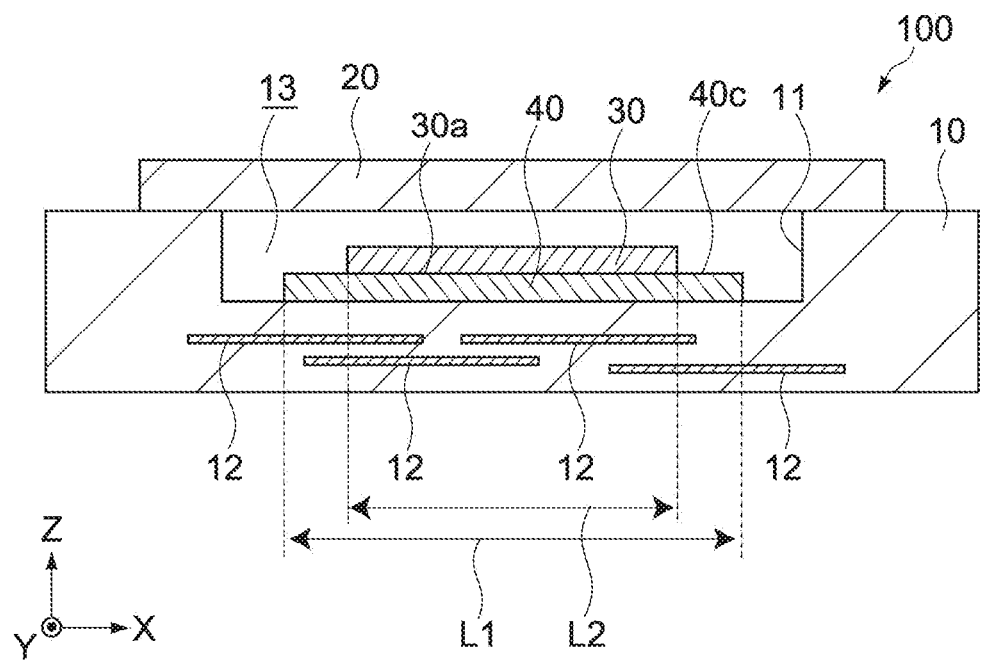
FIG. 9 is a cross-sectional view showing a solid-state imaging device according to an alternative embodiment 3.
Figure 10:
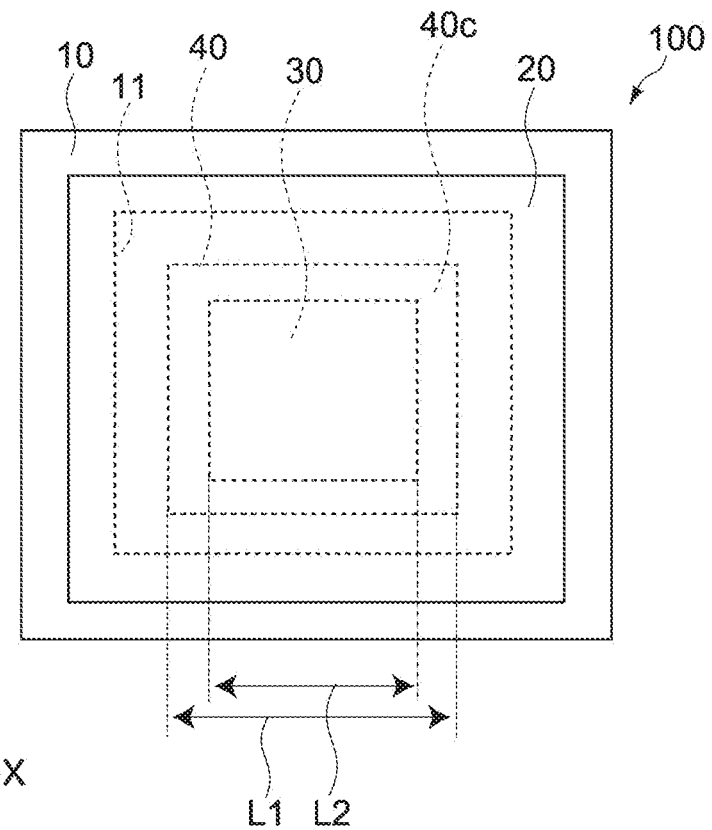
FIG. 10 is a plan view showing the solid-state imaging device.

FIG. 9 is a cross-sectional view showing the solid-state imaging device 100 according to an alternative embodiment 3, and FIG. 10 is a plan view showing the solid-state imaging device 100 according to an alternative embodiment 3. The solid-state imaging device 100 may have the structure that a length L1 of the shield 40 in the X direction is longer than a length L2 of the solid-state image sensor 30 in the X direction, as shown in FIG. 9.

In other words, as shown in FIG. 9, an area of a surface 40c (front surface) of the shield 40 that comes in contact with the solid-state image sensor 30 may be greater than an area of a surface 30a (back surface) of the solid-state image sensor 30 that comes in contact with the shield 40. As a result, it is possible to further improve shielding properties of the shield 40 that shields the solid-state image sensor 30 from the magnetic force lines M generated from the package wiring 12.

Alternative Embodiment 4

The shield 40 may be a die bonding film formed of adhesive resin containing particles of a magnetic material or a conductor such as copper and iron and may bond the solid-state image sensor 30 and the package 10. Alternatively, the shield 40 may be die bonding paste formed of silver paste containing particles of a magnetic material or a conductor such as copper and iron.

According to this structure, not only the magnetic force lines M generated from the package wiring 12 are prevented from arriving at the solid-state image sensor, but also the step of bonding the solid-state image sensor 30 to the shield 40 can be omitted when designing the solid-state imaging device 100. Accordingly, the productivity can be improved when the solid-state imaging device 100 is manufactured.

(Shape of Shield)

Figure 11:
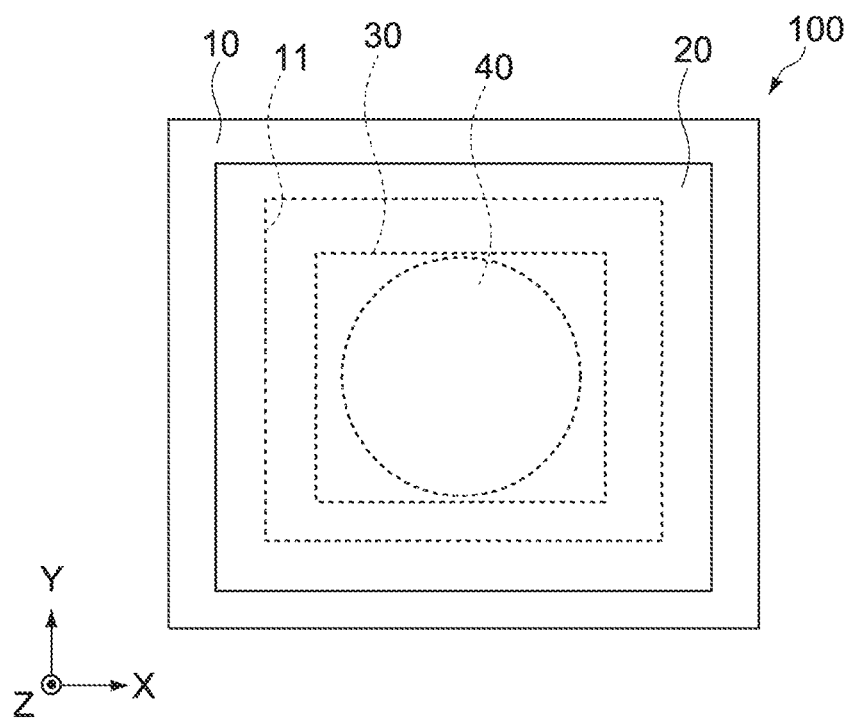
FIG. 11 is a schematic diagram showing a variation in a shape of the shield according to the embodiment.
Figure 12:
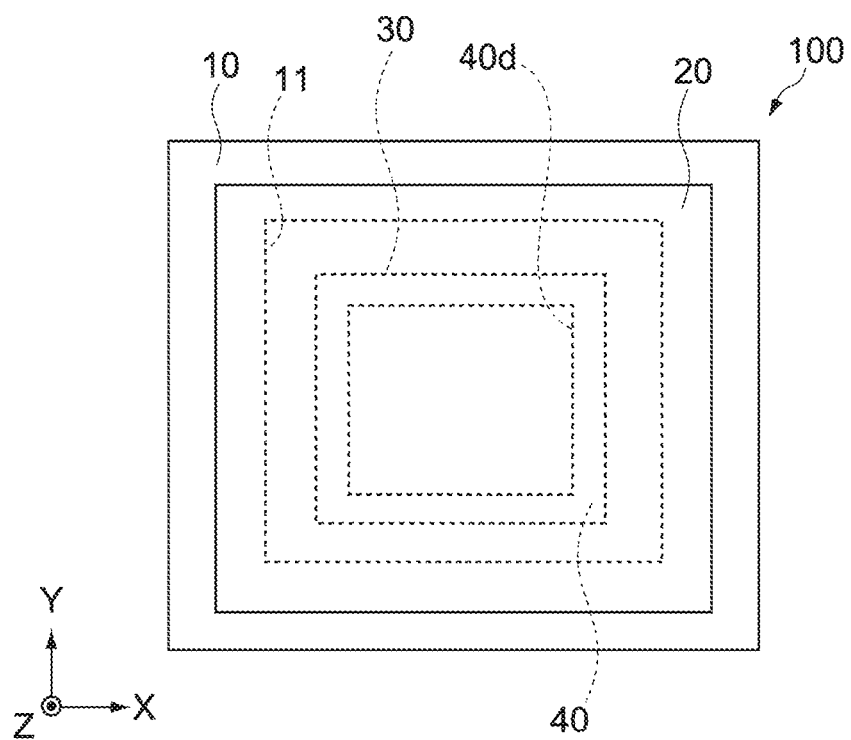
FIG. 12 is a schematic diagram showing a variation in a shape of the shield according to the embodiment.
Figure 13:
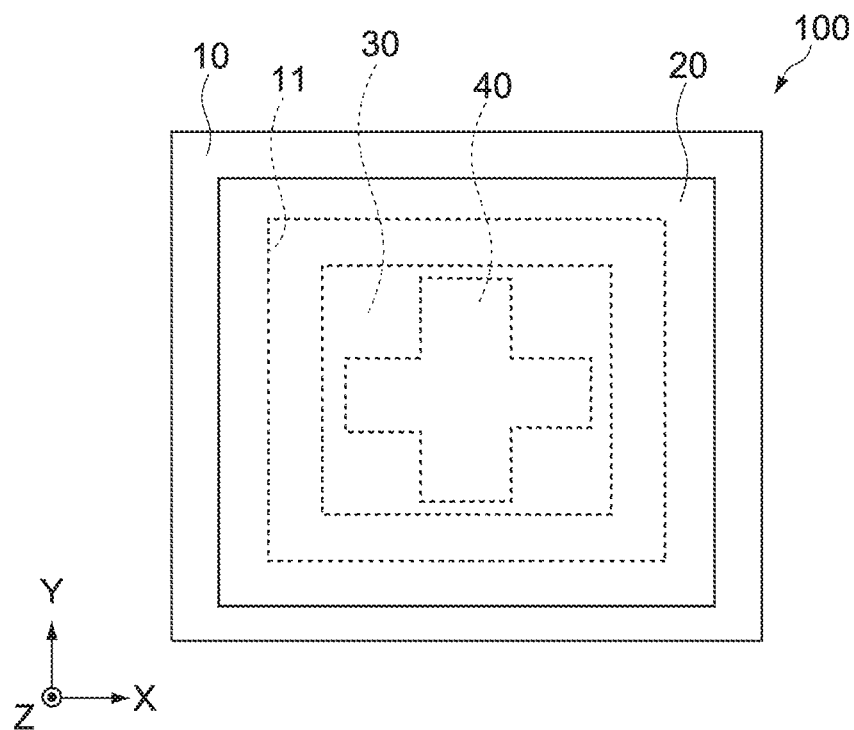
FIG. 13 is a schematic diagram showing a variation in a shape of the shield according to the embodiment.

FIG. 11 to FIG. 13 each is a plan view showing the solid-state imaging device 100 and is a schematic diagram showing a variation in a shape of the shield 40 of the solid-state imaging device 100. The shape of the shield 40 according to this embodiment is not limited to the shape shown in FIG. 1, FIG. 2, and FIG. 5 to FIG. 10. The shield may have any shape.

For example, the shape of the shield 40 may be a circle, as shown in FIG. 11. Alternatively, the shield 40 may be arranged along a periphery of the solid-state image sensor 30 between the solid-state image sensor 30 and the package 10 and may have a shape having a rectangular hole 40d, as shown in FIG. 12. Alternatively, the shield 40 may have a cross shape, as shown in FIG. 13.

[Solid-State Imaging Apparatus]

Figure 14:
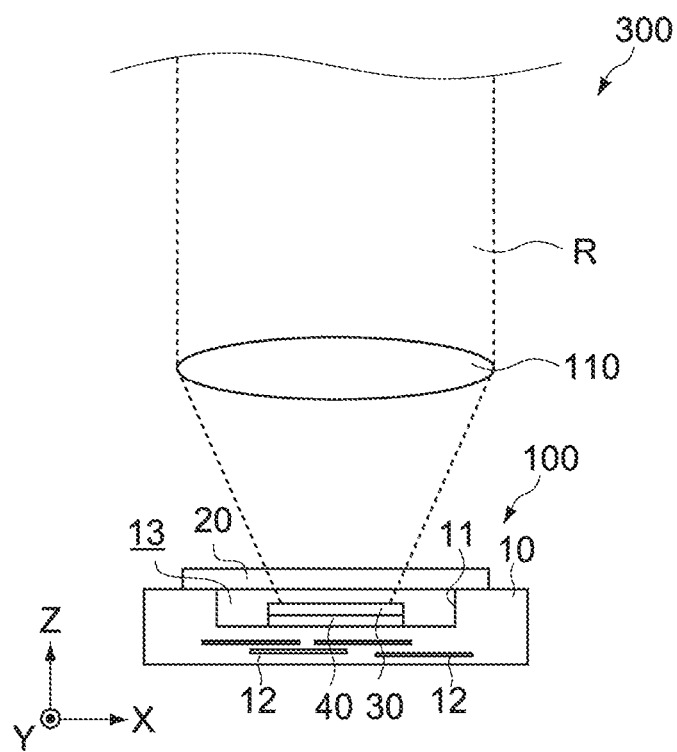
FIG. 14 is a schematic diagram showing a solid-state imaging apparatus according to an embodiment of the present technology.

FIG. 14 is a schematic diagram showing a solid-state imaging apparatus 300 according to this embodiment. As shown in FIG. 14, the solid-state imaging apparatus 300 includes an optical system for imaging 110 and the solid-state imaging device 100. The optical system for imaging 110 is an optical system that collects incident light R on the solid-state image sensor 30, as shown in FIG. 14.

The solid-state imaging apparatus 300 is not especially limited, but can be a still camera, a video camera, an FA (focus aid) camera, a monitor camera, a microscope, or the like, for example. Note that the solid-state imaging apparatus 300 on which the solid-state imaging device 100 is mounted is not limited to those listed above.

The embodiments of the present technology are described above, the present technology is not limited to the above-described embodiments, and it should be noted that various changes can be made.

For example, the present technology may also have the following structures.

(1) A solid-state imaging device, including:
a package including wiring inside and a recess;
a seal glass joined to the package and closing the recess;
a solid-state image sensor housed in a space formed by the recess and the seal glass; and
a shield housed in the space and arranged on the package, the shield preventing an arrival of magnetic force lines generated from the wiring at the solid-state image sensor.

(2) The solid-state imaging device according to (1), in which
the shield is arranged between the solid-state image sensor and the package.

(3) The solid-state imaging device according to (1), in which
the shield is arranged around the solid-state image sensor.

(4) The solid-state imaging device according to (1) or (2), in which
the shield includes a first shield and a second shield, and the first shield and the second shield are arranged at a distance between the solid-state image sensor and the package.

(5) The solid-state imaging device according to any one of (1) to (4), in which
the shield is formed of a magnetic material.

(6) The solid-state imaging device according to any one of (1) to (4), in which
the shield is a conductor formed of copper or iron.

(7) The solid-state imaging device according to any one of (1) to (4), in which The solid-state imaging device according to claim 1, in which
the shield is a die bonding film including a magnetic material and bonds the solid-state image sensor to the package.

(8) The solid-state imaging device according to any one of (1) to (4), in which
the shield is a die bonding film including a conductor formed of copper or iron and bonds the solid-state image sensor to the package.

(9) A solid-state imaging apparatus, including:
a solid-state imaging device including
a package including wiring inside and a recess,
a seal glass joined to the package and closing the recess,
a solid-state image sensor housed in a space formed by the recess and the seal glass, and
a shield housed in the space and arranged on the package, the shield preventing an arrival of magnetic force lines generated from the wiring at the solid-state image sensor; and
an optical system for imaging that collects incident light on the solid-state image sensor.

REFERENCE SIGNS LIST 100 solid-state imaging device
10 package
11 recess
12 package wiring
13 space
20 seal glass
30 solid-state image sensor
40 shield
M magnetic force lines

The invention claimed is:
1. A solid-state imaging device, comprising:
a package including wiring and a recess;
a seal glass attached to the package, wherein the seal glass closes the recess;

a solid-state image sensor in a space formed by the recess and the seal glass; and
a shield in the space and on the package, wherein
the shield comprises a die bonding film that includes a magnetic material,
the die bonding film bonds the solid-state image sensor to the package, and
the shield is configured to prevent an arrival of magnetic force lines generated from the wiring at the solid-state image sensor.

2. The solid-state imaging device according to claim 1, wherein the shield is between the solid-state image sensor and the package.

3. The solid-state imaging device according to claim 1, wherein the shield is around the solid-state image sensor.

4. The solid-state imaging device according to claim 1, wherein
the shield includes a first shield and a second shield, and
the first shield and the second shield are at a distance between the solid-state image sensor and the package.

5. The solid-state imaging device according to claim 1, wherein the shield comprises the magnetic material.

6. A solid-state imaging apparatus, comprising:
a solid-state imaging device including:
a package including wiring and a recess;
a seal glass attached to the package, wherein the seal glass closes the recess;
a solid-state image sensor in a space formed by the recess and the seal glass; and
a shield in the space and on the package, wherein
the shield comprises a die bonding film that includes a magnetic material,
the die bonding films bonds the solid-state image sensor to the package, and
the shield is configured to prevent an arrival of magnetic force lines generated from the wiring at the solid-state image sensor; and
an optical system configured to collect incident light on the solid-state image sensor.

7. A solid-state imaging device, comprising:
a package including wiring and a recess;
a seal glass attached to the package, wherein the seal glass closes the recess;
a solid-state image sensor in a space formed by the recess and the seal glass; and
a shield in the space and arranged on the package, wherein
the shield comprises a die bonding film that includes a conductor made of one of copper or iron,
the die bonding film bonds the solid-state image sensor to the package, and
the shield is configured to prevent an arrival of magnetic force lines generated from the wiring at the solid-state image sensor.

* * * * *